(12) United States Patent
Zhang et al.

(10) Patent No.: US 10,889,088 B2
(45) Date of Patent: Jan. 12, 2021

(54) FLEXIBLE SENSOR AND METHOD FOR MANUFACTURING THE SAME

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Youting Zhang, Beijing (CN); Haifeng Hu, Beijing (CN); Ming Zhang, Beijing (CN); Ting Zeng, Beijing (CN); Weijie Ma, Beijing (CN); Zhanqi Xu, Beijing (CN); Shuncheng Zhu, Beijing (CN)

(73) Assignees: BOE Technology Group Co., Ltd., Beijing (CN); HEFEI XINSHENG OPTOELECTRONICS TECHNOLOGY CO., LTD., Hefei (CN)

( * ) Notice: Subject to any disclaimer, the term of this patent is extended or adjusted under 35 U.S.C. 154(b) by 38 days.

(21) Appl. No.: 15/976,552

(22) Filed: May 10, 2018

(65) Prior Publication Data
US 2019/0176440 A1    Jun. 13, 2019

(30) Foreign Application Priority Data
Dec. 8, 2017  (CN) .......................... 2017 1 1297014

(51) Int. Cl.
| B32B 25/04 | (2006.01) |
| C01B 32/16 | (2017.01) |
| C01B 32/168 | (2017.01) |
| H05K 7/02 | (2006.01) |

(52) U.S. Cl.
CPC ............ B32B 25/042 (2013.01); C01B 32/16 (2017.08); C01B 32/168 (2017.08); H05K 7/02 (2013.01); *B32B 2457/00* (2013.01); *C01B 2202/06* (2013.01)

(58) Field of Classification Search
CPC .................................................. C01B 2202/06
See application file for complete search history.

(56) References Cited

FOREIGN PATENT DOCUMENTS

| CN | 103105123 A | 5/2013 |
| CN | 104142118 A | 11/2014 |
| CN | 104257367 A | 1/2015 |
| CN | 104880206 A | 9/2015 |
| CN | 106895931 A | 6/2017 |

(Continued)

OTHER PUBLICATIONS

Kanoun et al., "Flexible Carbon Nanotube Films for High Performance Strain Sensors," Sensors, 2014, 10042-10071. (Year: 2014).*

(Continued)

*Primary Examiner* — Ian A Rummel
(74) *Attorney, Agent, or Firm* — Dinsmore & Shohl LLP

(57) ABSTRACT

The present disclosure provides a flexible sensor and a method for manufacturing the same. The flexible sensor comprises: a substrate layer formed of flexible and plastic rubber; a conductive layer located on the substrate layer; a conductive contact and a passivation layer located on the conductive layer; and a wire which is connected to the conductive layer via the conductive contact and is used for conducting induced current.

7 Claims, 2 Drawing Sheets

(56) References Cited

FOREIGN PATENT DOCUMENTS

JP  2014-038088 A  2/2014
KR  20150002972 A  1/2015

OTHER PUBLICATIONS

Tadakaluru et al., "Stretchable and Flexible High-Strain Sensors Made Using Carbon Nanotubes and Graphite Films on Natural Rubber," Sensors, 2014, 14, 868-876. (Year: 2014).*
First Office Action for CN Appl. No. 201711297014.4, dated Sep. 29, 2019.

* cited by examiner

FLEXIBLE SENSOR AND METHOD FOR MANUFACTURING THE SAME

CROSS-REFERENCE TO RELATED APPLICATIONS

This application claims priority to Chinese Patent Application No. 201711297014.4, filed on Dec. 8, 2017, the disclosure of which is incorporated herein in its entirety by reference.

TECHNICAL FIELD

This disclosure relates to a flexible sensor and a method for manufacturing the same.

BACKGROUND

The flexibility of electronic products has become a main trend in recent years, and how to develop a sensor having good flexibility and extensibility has become an important research topic.

At present, a flexible sensor is manufactured in the industry generally by fabricating a substrate layer with polyurethane sponge or cellulose paper and then fabricating a conductive layer with a conductive material such as a metal oxide or a metal nanowire, etc. However, the substrate layer made of the polyurethane sponge or the cellulose paper has a problem of poor stretching performance, which may limit the application of the substrate layer.

In summary, there is a problem of poor stretching performance in the substrate layer of the flexible sensor manufactured in the industry at present.

SUMMARY

In view of the above problems, embodiments of the present disclosure provide a flexible sensor and a method for manufacturing the same.

A flexible sensor is provided in an embodiment of this disclosure, comprising: a substrate layer formed of flexible and plastic rubber; a conductive layer located on the substrate layer; a conductive contact and a passivation layer located on the conductive layer; and a wire which is connected to the conductive layer via the conductive contact and is used for conducting induced current.

Alternatively, the flexible and plastic rubber comprises polyvinyl-chloride-free rubber or thermo-plastic rubber.

Alternatively, material for forming the conductive layer comprises multi-walled carbon nanotubes.

Alternatively, the substrate layer and the conductive layer are adhered to each other by pressure.

A method for manufacturing a flexible sensor is provided in an embodiment of this disclosure, the method comprising:
performing a stretching process on flexible and plastic rubber to form a substrate layer;
depositing conductive material on the substrate layer to form a conductive layer;
forming a conductive contact and a passivation layer on the conductive layer; and
connecting the conductive contact with a wire for conducting inducted current.

Alternatively, the flexible and plastic rubber comprises polyvinyl-chloride-free rubber or thermo-plastic rubber.

Alternatively, the conductive material comprises multi-walled carbon nanotubes.

Alternatively, the substrate layer and the conductive layer are adhered to each other by pressure.

Alternatively, the step of depositing conductive material on the substrate layer to form a conductive layer comprises:
depositing particles of the multi-walled carbon nanotubes on the substrate layer;
performing a calendering process on the deposited particles of the multi-walled carbon nanotubes to form a first conductive layer; and
performing a pressing process on the first conductive layer until a thickness of the first conductive layer reaches a predetermined thickness threshold to form a second conductive layer.

Alternatively, the thickness threshold is determined according to a preset factory resistance of the flexible sensor and a weight of the deposited particles of the multi-walled carbon nanotube.

Alternatively, the step of performing a calendering process on the deposited particles of the multi-walled carbon nanotubes comprises:
rolling a roller on the deposited particles of the multi-walled carbon nanotubes to press the particles of the multi-walled carbon nanotubes to the first conductive layer.

Alternatively, the step of performing a pressing process on the first conductive layer until a thickness of the first conductive layer reaches a predetermined thickness threshold to form a second conductive layer comprises:
pressing the first conductive layer along a thickness direction of the first conductive layer using a mechanical press until the thickness of the first conductive layer reaches the predetermined thickness threshold to form the second conductive layer.

DETAILED DESCRIPTION

The present disclosure provides a flexible sensor and a method for manufacturing the same, in which flexible and plastic rubber is used as a substrate layer to avoid the limitation of the material for forming the substrate in the existing flexible sensor and improve the bending and the stretching capabilities of the flexible sensor.

The embodiments of the present disclosure provide a flexible sensor and a method for manufacturing the same. Due to the limitation of the stretchability and the extensibility of the material for forming the substrate layer of the current flexible sensor, the present disclosure forms a substrate layer from the flexible and plastic rubber which is made of material of polyvinyl-chloride-free (PVC-free) rubber or Thermo-Plastic Rubber (TPR). Because the rubber has better extensibility, compression resistance, and bendability than the existing material, it can avoid the limitation of the material for forming the substrate layer in the existing flexible sensor, and can improve the bending and the stretching capabilities of the flexible sensor. Furthermore, the conductive layer of the flexible sensor provided by the present disclosure can be also formed from material of multi-walled carbon nanotubes, thereby repeated processing steps of coating and photolithography can be avoided, which can simplify the processes, improve the efficiency, and reduce the cost.

Below, a clear and complete description will be given to the technical solution of this disclosure in combination with the drawings of embodiments of the present disclosure. Obviously, the described embodiments are merely some embodiments rather than all embodiments of this disclosure. All other embodiments obtained by those of ordinary skill in the art based on the embodiments of the present disclosure without inventive efforts shall fall within the protection scope of the present disclosure.

Figure 1:
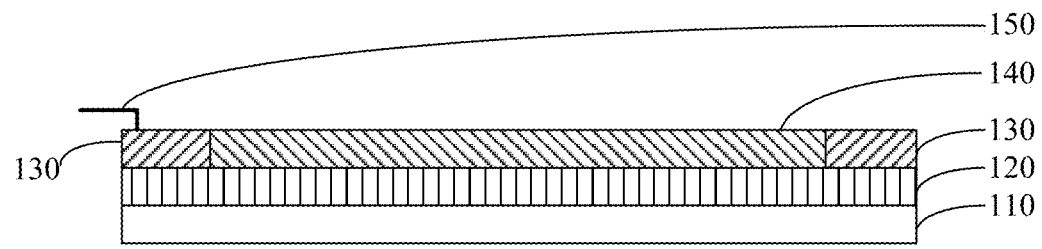
FIG. 1 is a schematic structural diagram of a flexible sensor provided by an embodiment of the present disclosure.

Referring to FIG. 1, a flexible sensor is provided in an embodiment of this disclosure, comprising: a substrate layer 110 formed of flexible and plastic rubber; a conductive layer 120 located on the substrate layer 110; a conductive contact 130 and a passivation layer 140 located on the conductive layer 120; and a wire 150 which is connected to the conductive layer 120 via the conductive contact 130 and is used for conducting induced current.

The material for forming the above rubber comprises material of polyvinyl-chloride-free (PVC-free) rubber or Thermo-Plastic Rubber (TPR). The material for forming the above conductive layer comprises multi-walled carbon nanotubes. The material for forming the above conductive contact comprises silver paste. The material for forming the above passivation layer comprises polyimide. The material for forming the above wire comprises metals such as copper.

Because the rubber has the properties of flexibility and strong extensibility and plasticity, the substrate layer made of the rubber also has the properties of strong extensibility and high bending and stretching capabilities, thereby avoiding the limitation of the substrate in the existing flexible sensor.

Moreover, since the multi-walled carbon nanotubes are used as the conductive material, a series of processing steps of coating, photolithography, etching and so on are avoided by replacing the existing metal oxide material with the multi-walled carbon nanotubes, thereby simplifying the processes, reducing the cost and improving the efficiency.

Figure 2:
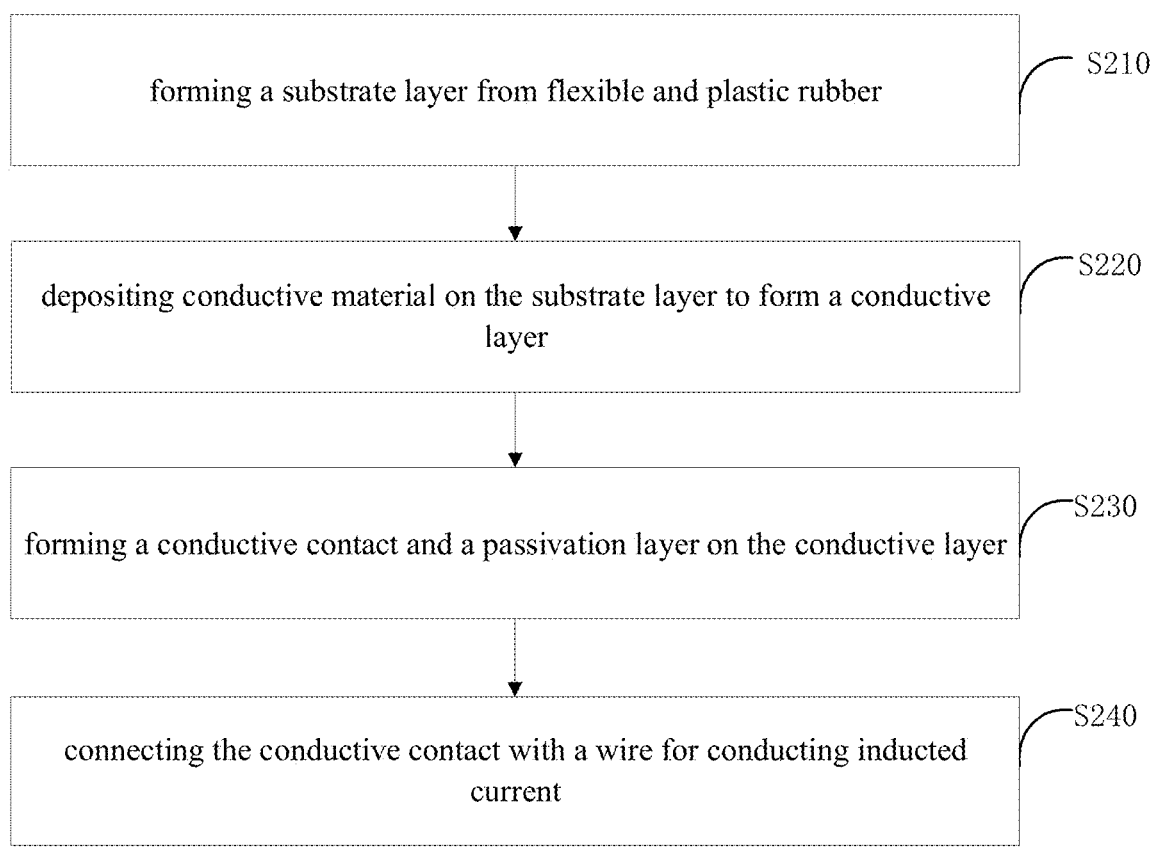
FIG. 2 is a schematic flowchart of a method for manufacturing the flexible sensor provided by the embodiment of the present disclosure.

Referring to FIG. 2, a method for manufacturing the above flexible sensor is provided in the embodiment of this disclosure, the method comprising:

S210: forming a substrate layer 110 from flexible and plastic rubber;

S220: depositing conductive material on the substrate layer 110 to form a conductive layer 120;

S230: forming a conductive contact 130 and a passivation layer 140 on the conductive layer 120;

S240: connecting the conductive contact 130 with a wire 150 for conducting inducted current.

The material for forming the flexible and plastic rubber in the step S210 comprises material of polyvinyl-chloride-free (PVC-free) rubber or Thermo-Plastic Rubber (TPR). The conductive material in the step S220 comprises particles of the multi-walled carbon nanotubes.

Regarding the step S210, forming the substrate layer may comprise, for example:

forming a film layer from material of polyvinyl-chloride-free (PVC-free) rubber or Thermo-Plastic Rubber (TPR);

performing stretching and bending processes on the formed film layer repeatedly until bubbles and gaps in the film layer are exposed, to further improve the adhesion to the conductive layer, wherein the stretching process may comprise, for example, the transverse inflating stretching and the longitudinal pulling stretching;

cleaning the processed film layer with plasma water; in order to further ensure that the impurities on the film layer can be cleaned, the cleaned film layer can be placed in isopropyl alcohol for ultrasonic processing, and the time of the ultrasonic processing can be, for example, 3 minutes;

drying the cleaned film layer at a certain temperature, wherein the time of the drying process can be, for example, 20 minutes; and determining the film layer subjected to the drying process as the substrate layer.

Figure 3A:
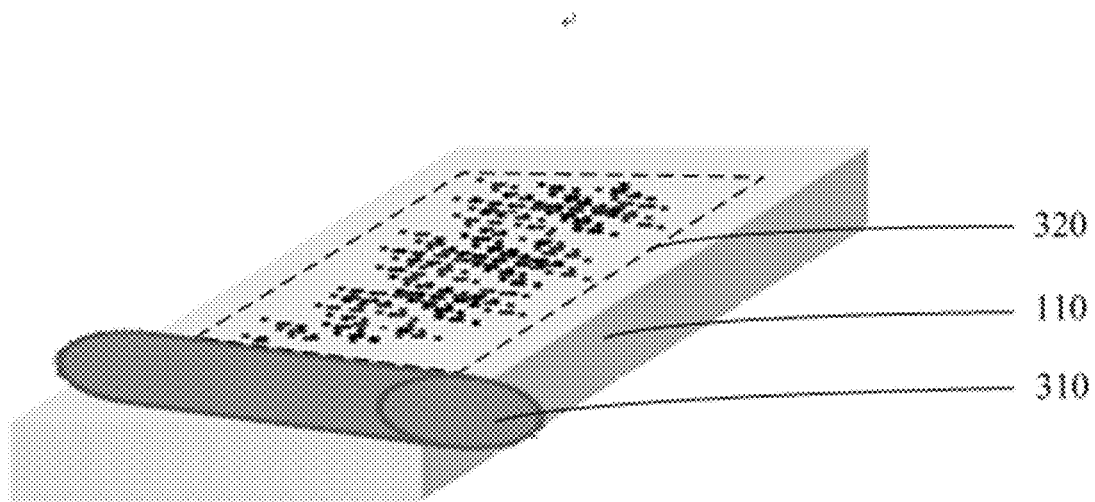
FIGS. 3a and 3b are schematic views of forming a conductive layer according to an embodiment of the present disclosure.
Figure 3B:
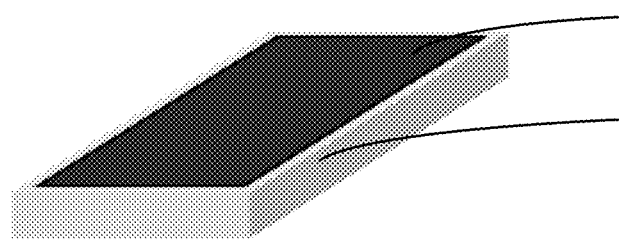

Regarding the step S220, forming the conductive layer may comprise, for example:

depositing particles of the multi-walled carbon nanotubes on the substrate layer formed in the step S210;

rolling a pressure roller 310 back and forth on the deposited particles of the multi-walled carbon nanotubes 320 (as shown in FIG. 3a) until the particles of the multi-walled carbon nanotubes 320 are evenly and flatly laid on the substrate layer, to form a first conductive layer 330 through a pressing process (as shown in FIG. 3b); since the thickness of the first conductive layer is greater than a predetermined thickness threshold, that is, the thickness of the first conductive layer is related to a factory initial value of the resistance of the conductive layer, and is inversely proportional to the factory initial value of the resistance of the conductive layer; the thickness of the first conductive layer is also related to the number of times the roller rolls back and forth on the conductive layer, thus the number of times the pressure roller rolls back and forth on the conductive layer is related to the factory initial value of the resistance of the conductive layer, and is inversely proportional to the factory initial value of the resistance of the conductive layer;

cleaning away the excess particles of the multi-walled carbon nanotubes 320 with deionized water, and cleaning the surface of the first conductive layer; and pressing the first conductive layer along the thickness direction of the first conductive layer using a mechanical press until the thickness of the first conductive layer reaches the predetermined thickness threshold, to form the second conductive layer, i.e., the conductive layer 120; for example, both the pressure of the mechanical press and the pressing time are related to the thickness of the second conductive layer, that is, both the pressure of the mechanical press and the pressing time are related to the preset thickness threshold, and both the pressure of the mechanical press and the pressing time are related to the factory initial value of the resistance of the conductive layer and are inversely proportional to the factory initial value of the resistance of the conductive layer.

Since the weight of the particles of the multi-walled carbon nanotubes is certain and the factory value of the resistance of the flexible sensor is also certain, the thickness of the conductive layer, i.e., the preset thickness threshold is also certain. That is, the above step is used to achieve the factory initial value of the resistance of the conductive layer.

Regarding the step S230, forming the conductive contact 130 and the passivation layer 140 may comprise, for example:

printing the conductive silver paste on the conductive layer to form the conductive contact; and passivating the conductive layer with the polyimide to form the passivation layer.

Regarding the step S240 of connecting the conductive contact 130 with the wire 150, the wire 150 may be, for example, a copper wire.

The method for manufacturing the flexible sensor provided by the disclosure is solvent-free, and the adhesiveness between the conductive layer and the substrate layer is ensured by pressing, so as to ensure that the sensor can be restored to its original shape after deformation.

In summary, the embodiments of the present disclosure provide a flexible sensor and a method for manufacturing the same. Due to the limitation of the stretchability and the extensibility of the material for forming the substrate layer of the current flexible sensor, the present disclosure forms a substrate layer from the flexible and plastic rubber which is made of material of polyvinyl-chloride-free (PVC-free) rubber or Thermo-Plastic Rubber (TPR). Because the rubber has better extensibility, compression resistance, and bendability than the existing material, it can avoid the limitation of the material for forming the substrate layer in the existing flexible sensor, and can improve the bending and the stretching capabilities of the flexible sensor. Furthermore, the conductive layer of the flexible sensor provided by the present disclosure can be also formed from the multi-walled carbon nanotubes, thereby repeated processing steps of coating and photolithography can be avoided, which can simplify the processes, improve the efficiency, and reduce the cost.

One skilled in the art should understand that, the embodiments of this disclosure may be provided as a method, a system, or a computer program product. Therefore, the embodiments of this disclosure can take the form of an entirely hardware embodiment, an entirely software embodiment or an embodiment combining hardware and software aspects. Moreover, the present disclosure may take the form of a computer program product embodied on one or more computer-usable storage media (including, but not limited to, disk storage, optical storage, etc.) having computer-usable program codes embodied therein.

It will be apparent to those skilled in the art that various modifications and variations can be made to the embodiments of this disclosure without departing from the spirit or scope of this disclosure. In this case, if the modifications and variations made to the present disclosure fall within the scope of the claims of the present disclosure and equivalents thereof, the present disclosure is intended to comprise the modifications and variations.

What is claimed is:

1. A method for manufacturing a flexible sensor, comprising:
   performing a stretching process on flexible and plastic rubber to form a substrate layer;
   depositing a conductive material on the substrate layer to form a conductive layer;
   forming a conductive contact and a passivation layer on the conductive layer; and
   connecting the conductive contact with a wire for conducting inducted current,
   wherein the flexible and plastic rubber comprises thermo-plastic rubber;
   wherein performing the stretching process on the flexible and plastic rubber to form the substrate layer comprises:
      forming a film layer from the thermo-plastic rubber; and
      performing stretching and bending processes on the formed film layer repeatedly until bubbles and gaps in the film layer are exposed, wherein the stretching process comprises transverse inflating stretching and longitudinal pulling stretching; and
   wherein forming the passivation layer on the conductive layer comprises:
      passivating the conductive layer with the polyimide to form the passivation layer.

2. The method according to claim 1, wherein the conductive material comprises multi-walled carbon nanotubes.

3. The method according to claim 1, wherein the substrate layer and the conductive layer are adhered to each other by pressure.

4. The method according to claim 2, wherein the step of depositing the conductive material on the substrate layer to form the conductive layer comprises:
   depositing particles of the multi-walled carbon nanotubes on the substrate layer;
   performing a calendering process on the deposited particles of the multi-walled carbon nanotubes to form a first conductive layer; and
   performing a pressing process on the first conductive layer until a thickness of the first conductive layer reaches a predetermined thickness threshold to form a second conductive layer.

5. The method according to claim 4, wherein the thickness threshold is determined according to a preset factory resistance of the flexible sensor and a weight of the deposited particles of the multi-walled carbon nanotube.

6. The method according to claim 4, wherein the step of performing the calendering process on the deposited particles of the multi-walled carbon nanotubes comprises:
   rolling a roller on the deposited particles of the multi-walled carbon nanotubes until the particles of the multi-walled carbon nanotubes are evenly and flatly laid on the substrate layer.

7. The method according to claim 6, wherein the step of performing the pressing process on the first conductive layer until the thickness of the first conductive layer reaches the predetermined thickness threshold to form the second conductive layer comprises:
   pressing the first conductive layer along a thickness direction of the first conductive layer using a mechanical press until the thickness of the first conductive layer reaches the predetermined thickness threshold to form the second conductive layer.

* * * * *

UNITED STATES PATENT AND TRADEMARK OFFICE
CERTIFICATE OF CORRECTION

PATENT NO. : 10,889,088 B2
APPLICATION NO. : 15/976552
DATED : January 12, 2021
INVENTOR(S) : Zhang et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 160 days.

Signed and Sealed this
Second Day of August, 2022

Katherine Kelly Vidal
*Director of the United States Patent and Trademark Office*